United States Patent
Mazur et al.

(10) Patent No.: US 10,541,136 B2
(45) Date of Patent: Jan. 21, 2020

(54) N-TYPE DOPING OF STRAINED EPITAXIAL GERMANIUM FILMS THROUGH CO-IMPLANTATION AND NANOSECOND PULSED LASER MELTING

(71) Applicant: President and Fellows of Harvard College, Cambridge, MA (US)

(72) Inventors: Eric Mazur, Concord, MA (US); Michael J. Aziz, Concord, MA (US); Hemant Gandhi, Cambridge, MA (US); David Pastor, Cambridge, MA (US)

(73) Assignee: PRESIDENT AND FELLOWS OF HARVARD COLLEGE, Cambridge, MA (US)

( * ) Notice: Subject to any disclaimer, the term of this patent is extended or adjusted under 35 U.S.C. 154(b) by 0 days.

(21) Appl. No.: 15/825,398

(22) Filed: Nov. 29, 2017

(65) Prior Publication Data
US 2018/0151361 A1    May 31, 2018

Related U.S. Application Data

(60) Provisional application No. 62/427,498, filed on Nov. 29, 2016.

(51) Int. Cl.
| | |
|---|---|
| *H01L 21/02* | (2006.01) |
| *H01L 21/265* | (2006.01) |
| *H01L 21/268* | (2006.01) |
| *H01L 21/324* | (2006.01) |
| *H01L 29/167* | (2006.01) |
| *H01L 21/67* | (2006.01) |
| *B23K 26/06* | (2014.01) |
| *B23K 26/0622* | (2014.01) |
| *H01L 29/36* | (2006.01) |
| *B23K 26/352* | (2014.01) |

(52) U.S. Cl.
CPC .... *H01L 21/02686* (2013.01); *B23K 26/0622* (2015.10); *B23K 26/0643* (2013.01); *H01L 21/02381* (2013.01); *H01L 21/02532* (2013.01); *H01L 21/268* (2013.01); *H01L 21/26513* (2013.01); *H01L 21/324* (2013.01); *H01L 21/67115* (2013.01); *H01L 29/167* (2013.01); *H01L 29/36* (2013.01); *B23K 26/352* (2015.10); *H01L 21/02395* (2013.01); *H01L 21/02422* (2013.01)

(58) Field of Classification Search
CPC .............. H01L 29/16; H01L 21/02532; H01L 21/02381
See application file for complete search history.

(56) References Cited

U.S. PATENT DOCUMENTS

| | | | |
|---|---|---|---|
| 9,692,209 B2 * | 6/2017 | Bessette | ............. H01L 21/0237 |
| 2014/0254620 A1 * | 9/2014 | Bessette | ............. H01L 21/0237 |
| | | | 372/45.01 |

* cited by examiner

*Primary Examiner* — Douglas M Menz
(74) *Attorney, Agent, or Firm* — Nelson Mullins Riley & Scarborough LLP; Thomas J. Engellenner; Reza Mollaaghababa (57) ABSTRACT

In one aspect a method of fabricating an n-doped strained germanium (Ge) film is disclosed, which includes depositing a strained Ge film on an underlying substrate, implanting at least one electron-donating dopant in the Ge film, and exposing the implanted Ge film to one or more laser pulses having a pulsewidth in a range of about 1 ns to about 100 ms so as to generate a substantially crystalline strained Ge film. In some embodiments, the pulses can cause melting followed by substantial recrystallization of at least a portion of the implanted Ge film. In some embodiments, the resultant Ge film can have a thickness in a range of about 10 nm to about 1 microns.

10 Claims, 7 Drawing Sheets

---

Growing epitaxially a strained Ge film on an underlying substrate, e.g., a silicon substrate Implanting phosphorus and fluorine ions into the epitaxially grown Ge film so as to generate a concentration of n doner of at least about $5 \times 10^{19}$ cm$^{-3}$ Annealing the doped Ge film via the application of one or more laser pulses thereto so as to melt at least a portion of the doped Ge film followed by its regrowth Growing epitaxially a strained Ge film on an underlying substrate, e.g., a silicon substrate Implanting phosphorus and fluorine ions into the epitaxially grown Ge film so as to generate a concentration of n doner of at least about $5 \times 10^{19}$ cm$^{-3}$ Annealing the doped Ge film via the application of one or more laser pulses thereto so as to melt at least a portion of the doped Ge film followed by its regrowth

FIG. 7

N-TYPE DOPING OF STRAINED EPITAXIAL GERMANIUM FILMS THROUGH CO-IMPLANTATION AND NANOSECOND PULSED LASER MELTING

RELATED APPLICATIONS

The present application claims priority to a provisional application titled "N-type doping of strained epitaxial germanium films through co-implantation and nanosecond pulsed laser melting," having Application No. 62/427,498 and filed on Nov. 29, 2016, which is herein incorporated by reference in its entirety.

FEDERAL SUPPORT

The present application was made with United States government support under the Grant No. FA9550-14-1-0150 from the U.S. Air Force Office of Scientific Research and National Defense and Engineering Graduate Fellowship DGE 0946799 by the Department of Defense. The United States government has certain rights in this invention.

FIELD

The present disclosure relates generally to methods and systems for generating n-doped strained films on an underlying substrate. More particularly, in some aspects, the present teachings relate to n-doped strained germanium films.

BACKGROUND

The present invention relates generally to methods for generating highly n-doped strained Ge films as well as semiconductor structures that include such films.

Germanium has emerged as a promising material platform for the next generation of silicon CMOS compatible devices. Its high electron and hole mobilities, a direct transition at 1.55 μm, and the possibility to grow it directly on a silicon substrate makes germanium (Ge) especially desirable for silicon integrated electronic and photonic applications. Ge on silicon is becoming a mainstream material, already used in commercial infrared photodetectors and high speed MOSFETs.

Despite this success, the challenge of obtaining high active n+Ge doping has been a persistent bottleneck to further development of Ge devices. High active n+ carrier concentrations are desirable for forming Ohmic contact in fabrication of low parasitic resistance n-MOSFETs and for facilitating population inversion and lasing emission near 1.55 μm. In many such applications, not only a high active n+Ge doping but also a high tensile strain is also desirable.

Conventional doping methods like in-situ, gas-phase doping, or conventional ion implantation followed by a standard thermal annealing, are unable to achieve an active donor concentration of greater than about $5 \times 10^{19}$ cm$^{-3}$, regardless of the chemical concentration of donors. Some studies suggest that this low carrier activation may be due to the formation of negatively charged donor-vacancy (DV) clusters that compensate acceptors.

A number of approaches have been proposed to manage the vacancies and DV pairs that may be the cause of low donor activation, including multiple implantations, irradiation to introduce interstitials and co-doping. But such approaches have not been fruitful in generating high active n+ carrier concentrations in Ge.

Accordingly, there is a need for methods for fabricating highly n-doped strained Ge films, and for semiconductor structures including such films.

SUMMARY

In one aspect, a method of fabricating an n-doped strained germanium (Ge) film is disclosed, which includes depositing a strained Ge film on an underlying substrate, implanting at least one dopant, e.g., an electron-donating dopant, in the Ge film, and exposing the implanted Ge film to one or more laser pulses having a pulsewidth in a range of about 1 ns to about 100 ms so as to generate a substantially crystalline strained Ge film. In some embodiments, the pulses can cause substantial recrystallization of at least a portion of the implanted Ge film. In some embodiments, the resultant Ge film can have a thickness in a range of about 10 nm to about 1 micron.

In some embodiments, the implantation step and the step of exposing the doped Ge film to laser pulses are configured such that the substantially crystalline strained Ge film has an active n-type donor concentration of at least about $5 \times 10^{19}$ cm$^{-3}$. For example, the active n-type donor concentration can be in a range of about $5 \times 10^{19}$ cm$^{-3}$ to about $2 \times 10^{20}$ cm$^{-3}$, e.g., $10^{20}$ cm$^{-3}$. In some embodiments, the n-doped strained Ge film can exhibit a charged carrier concentration in a range of about $5 \times 10^{15}$ cm$^{-3}$ to about $5 \times 10^{20}$ cm$^{-3}$.

In some embodiments, the step of depositing the Ge film on the underlying substrate can include epitaxially growing the Ge film on the underlying substrate.

In some embodiments, the underlying substrate can be a semiconductor or an insulator. Some examples of suitable materials for the underlying substrate include, without limitation, silicon, silicon dioxide and GaAs.

In some embodiments, the implanting step includes co-implanting at least two dopants into the Ge film, where at least one of the dopants is an electron-donating dopant. In some such embodiments, at least one of the dopants is capable of passivating vacancies, if any, in the Ge film. By way of example, in some embodiments, the electron-donating dopant can be any of antimony, phosphorus and arsenic. Examples of suitable passivating dopants include, without limitation, fluorine, nitrogen and carbon.

In some embodiments, the implantation dose of each dopant is selected such that the dopants collectively generate a donor concentration of at least about $5 \times 10^{19}$ cm$^{-3}$, e.g., in a range of $5 \times 10^{19}$ cm$^{-3}$ to about $2 \times 10^{20}$ cm$^{-3}$, in the Ge film. By way of example, the electron-donating dopant can be implanted in the Ge film with an implantation dose in a range of about $10^{12}$ to about $10^{16}$ cm$^{-2}$ and another dopant can be co-implanted in the Ge film with the electron-donating dopant with an implantation dose in a range of about $10^{12}$ to about $10^{16}$ cm$^{-2}$.

In some embodiments, the laser pulses can have a pulsewidth in a range of about 1 ns to about 500 ns, or in a range of about 1 ns to about 300 ns, or in a range of about 10 ns to about 200 ns. Further, in some such embodiments, the laser pulses can have a fluence at the illuminated film's surface in a range of about 0.1 to about 3.5 J/cm$^2$.

In some embodiments, the laser pulses can cause melting and recrystallization of at least a portion of the doped Ge layer. In some such embodiments, the laser pulses can cause melting of the entire doped Ge film followed by its recrystallization. In many embodiments, the implantation of dopants into the Ge layer can result in the amorphization of at least a portion of the Ge layer and the laser pulses can cause recrystallization of the amorphous portion.

In some embodiments, subsequent to the application of the laser pulses, the Ge film exhibits a tensile strain, e.g., a tensile in-plane strain, in a range of about 0.1% to about 3%, e.g., in a range of about 0.1% to about 0.3%. In some such embodiments, such a Ge film can exhibit an out-of-plane strain, e.g., a compressive strain, of at least about 0.12%, e.g., in a range of about 0.12% to about 3%.

In a related aspect, a semiconductor structure is disclosed, which includes a support substrate and an n+-doped strained Ge film disposed on the support substrate, where the Ge film has an active n-type donor concentration of at least about $5 \times 10^{19}$ cm$^{-3}$. In some embodiments, the Ge film has an active n-type donor concentration in a range of about $5 \times 10^{19}$ cm$^{-3}$ to about $2 \times 10^{20}$ cm$^{-3}$. A variety of support substrates can be used. By way of example, the support substrate can be a semiconductor or an insulator. Some examples of suitable support substrates include, without limitation, any of silicon, silicon dioxide and GaAs.

In some embodiments of the above semiconductor structure, the n-doped strained Ge film includes at least two different dopants, where at least one of the dopants is an electron-donating dopant. By way of example, the electron-donating dopant can be any of antimony, phosphorus and arsenic. In some embodiments, at least one of the dopants can be any of fluorine, nitrogen and carbon.

In some embodiments of the above semiconductor structure, the Ge film has a thickness in a range of about 10 nm to about 1 micron. Further, in some embodiments, the Ge film exhibits a tensile strain in a range of about 0.1% to about 3%, e.g., in a range of about 0.1% to about 2%, or in a range of about 0.1% to about 1%, or in a range of about 0.1% to about 0.3%.

In a related aspect, a method of fabricating an n-doped strained Ge film is disclosed, which includes forming a strained Ge film, e.g., epitaxially, on an underlying substrate, implanting at least one electron-donating dopant into the Ge film, and annealing any of crystal damage and defects in the implanted Ge film via exposure thereof to one or more laser pulses having a pulsewidth in a range of about 1 ns to about 100 ms, e.g., in a range of about 1 ns to about 500 ns. In some embodiments, the laser pulses can have a fluence at the illuminated surface of the Ge film in a range of about 0.1 to about 3.5 J/cm$^2$.

In some embodiments, the annealed Ge film exhibits a strain, e.g., a tensile strain, such as an in-plane tensile strain, in a range of about 0.1% to about 3%.

The underlying substrate can be formed of a variety of different materials. By way of example, the underlying substrate can be any of silicon, silicon dioxide and GaAs.

Further understanding of various aspects of the invention can be obtained by reference to the following detailed description in conjunction with the associated drawings, which are described below.

BRIEF DESCRIPTION OF THE DRAWINGS

The present disclosure is described with reference to the following figures, which are presented for the purpose of illustration only and are not intended to be limiting.

In the drawings.

DETAILED DESCRIPTION

The present invention relates generally to methods for fabricating highly n-doped strained Ge films having a high concentration of active n-type donors, and to semiconductor structures that incorporate such films. As discussed in more detail below, in many embodiments, an epitaxially-grown Ge film can be subjected to co-implantation of at least two dopant ions, at least one of which is an n-type donor, followed by laser processing of the doped Ge film. It has been unexpectedly discovered that even after laser annealing, the highly doped Ge film exhibits a tensile strength, which in many cases is substantially equal to the tensile strength prior to laser processing. Various terms are used herein consistent with their ordinary meanings in the art. For additional clarity, the following terms are defined as follows:

An active donor refers to a dopant that contributes electron(s) to the conduction band. For example, an active donor contributes free electrons that are not bound to vacancies. An n-type donor, herein also referred to as an electron-donating dopant, is typically an atom that has more valence electrons than those of the atoms of the semiconductor material in which the donor is introduced as a dopant.

The term "a strained film" refers to a layer of a substantially crystalline material layer, a layer of germanium, which exhibits one or more lattice constants that deviate from respective equilibrium lattice constants. This deviation is herein indicated as a percentage deviation, which can be determined experimentally using, e.g., X-ray crystallography or Raman spectroscopy. Typically, the strain can be expressed as a tensor quantity.

The term "substantially" as used herein refers to a deviation of at most 5% relative to a complete state or condition. For example, the term "substantially crystalline" refers to a material that exhibits a crystalline order with deviations, if any, from a perfect crystalline order of less than 5%.

The term "about" as used herein indicates a variation of at most 10% around a numerical value.

Figure 1:
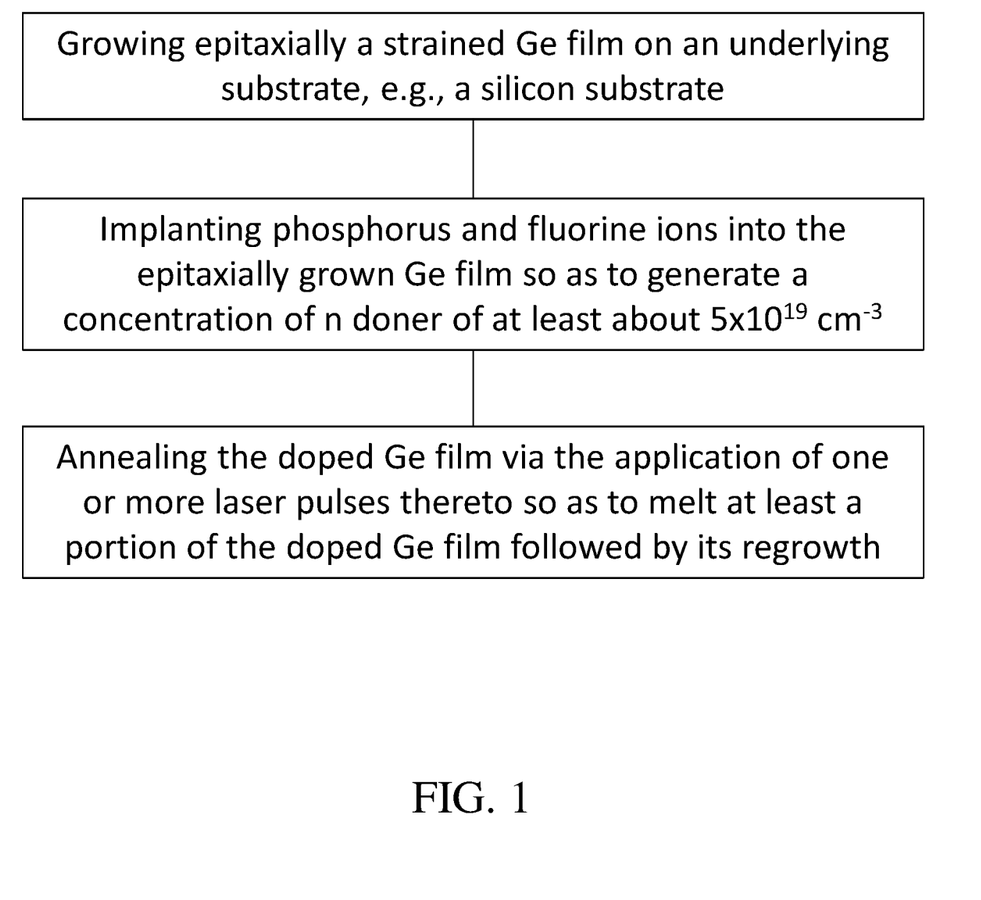
FIG. 1 is a flow chart of various steps in an exemplary embodiment for forming n-doped strained Ge film in accordance with aspects of the present disclosure.

With reference to the flow chart of FIG. 1, in an embodiment of a method for generating a highly n-doped strained Ge film, a Ge film is grown epitaxially on a surface of an underlying substrate (step 1). A variety of underlying substrates can be used, e.g., silicon, silicon dioxide and GaAs. In this embodiment, the epitaxial formation of the Ge film results in a crystalline film that exhibits a tensile strain, e.g., an in-plane tensile strain in a range of about 0.1% to about 3%. In some embodiments, a Ge buffer layer is initially grown on the underlying substrate at a low temperature to prevent islanding followed by growing the remainder of the Ge layer at a higher temperature. In some embodiments, a high degree of tensile strain can be achieved by patterning a Ge film epitaxially grown on an underlying oxide layer (e.g., a silicon oxide layer) into a microbridge with a narrow central cross-section and larger outer cross-sections. The underlying oxide layer can be underetched by selectively removing the underlying buried oxide layer, e.g., with hydrofluoric acid, which can lead to relaxation of the strain in the outer cross-sections and a concomitant increase in the strain in the narrow central cross-section. Further details regarding such a method for generating a highly strained Ge film can be obtained, e.g., in an article entitled "Group IV Direct Band Gap Photonics: Methods, Challenges, and Opportunities," by Richard Geiger and published in Frontiers in Materials, July 2015, vol. 2, article 52, which is herein incorporated by reference in its entirety.

In some embodiments, the thickness of the epitaxially-grown Ge film can be in a range of about 10 nm to about 1 micron, e.g., in a range of about 10 nm to 500 nm, or in a range of about 20 nm to about 400 nm, or in a range of about 30 nm to about 300 nm.

Subsequently, in this embodiment, fluorine and phosphorus ions are implanted into the epitaxially-grown Ge film (step 2). More specifically, the Ge film can be exposed to a beam of phosphorus ions to implant a selected dose of the ions therein. By way of example, the Ge film can be exposed to a phosphorus ion beam having an energy in a range of about 3 to about 800 keV and a phosphorus dose in a range of about $10^{12}$ cm$^{-2}$ to about $10^{16}$ cm$^{-2}$ can be implanted in the Ge film. In this embodiment, the phosphorus implantation is followed by implanting fluorine ions in the Ge film by exposing the Ge film to a fluorine ion beam having an energy in a range of about 1 to about 500 keV and a fluorine dose in a range of about $10^{12}$ cm$^{-2}$ to about $10^{16}$ cm$^{-2}$ is implanted into the Ge film.

In some embodiments, the energies of the phosphorus and fluorine ions are chosen such that both phosphorus and fluorine are deposited at a desired depth, e.g., at a depth in a range of about 10 nm to about 1000 nm, with a straggle, e.g., in a range of about 10 nm to about 250 nm, around that depth.

In other embodiments, other dopants can be implanted into the Ge film, where at least one of the dopants is an electron-donating donor. Without being limited to any particular theory, in many embodiments one or more dopants are implanted in the Ge film so as to contribute electrons to the conduction band and one or more dopants are implanted in the Ge film so as to passivate vacancies, if present, in the Ge film. As noted above, some examples of suitable dopants include antimony, phosphorus, arsenic, carbon, nitrogen, and fluorine, though other dopants can also be used.

In some embodiments, the implanted dosages of the phosphorus and the fluorine ions are selected so as to generate a concentration of at least about $5\times10^{19}$ cm$^{-3}$ of n-type donors within the epitaxially-grown Ge film. For example, the concentration of the n-type donors in the Ge film can be in a range of about $5\times10^{19}$ cm$^{-3}$ to about $2\times10^{20}$ cm$^{-3}$.

With continued reference to the flow chart of FIG. 1, following the co-implantation of phosphorus and fluorine in the epitaxially-grown Ge film, the doped film is exposed to one or more laser pulses. By way of example, the applied pulses can have a pulsewidth in a range of about 1 ns to about 100 ms, e.g., in a range of about 1 ns to 500 ns, or in a range of about 10 ns to 300 ns. In some embodiments, the central wavelength of the pulses can be in a range of about 198 nm to about 1064 nm. Further, in some embodiments, the fluence of the nanosecond pulses at the Ge film can be, for example, in a range of about 0.1 J/cm$^2$ to about 3.5 J/cm$^2$.

In some embodiments, the application of the laser pulse(s) to the doped Ge film can cause melting of at least a portion of that film, e.g., up to a depth corresponding to at least about 40%, or at least about 50%, or at least about 60%, or at least about 70%, or at least about 80%, or at least 90% of the film's thickness, followed by its recrystallization. In some embodiments, the fluence of the pulses is selected such that the applied laser pulses cause the melting of the entire Ge film. In some cases, the melting caused by the laser pulses can extend through the Ge film into a portion of the underlying substrate.

It has been unexpectedly discovered that the resultant doped Ge film obtained after the step of exposing the doped Ge film to laser pulses exhibits a tensile strain. By way of example, the resultant doped Ge film can exhibit an in-plane tensile strain of at least about 0.1%, for example, in a range of about 0.1% to about 3%, e.g., in a range of about 0.1% to about 0.3%, or in a range of about 0.1% to about 1%, or in a range of about 0.1% to about 2%. In some embodiments, the laser-processed doped Ge film exhibits a tensile strength that is substantially the same as the tensile strain exhibited by the epitaxially-grown Ge film prior to its doping.

In some embodiments, the above laser processing of the doped Ge film can activate at least some of the inactive n-type donors, which were introduced into the Ge film during the implantation of phosphorus and fluorine ions into the epitaxially-grown Ge film.

Hence, the above method can be used to fabricate a Ge film that exhibits a high concentration of active n-type donors as well as a tensile strength, e.g., a tensile strength greater than about 0.1%.

Figure 2:
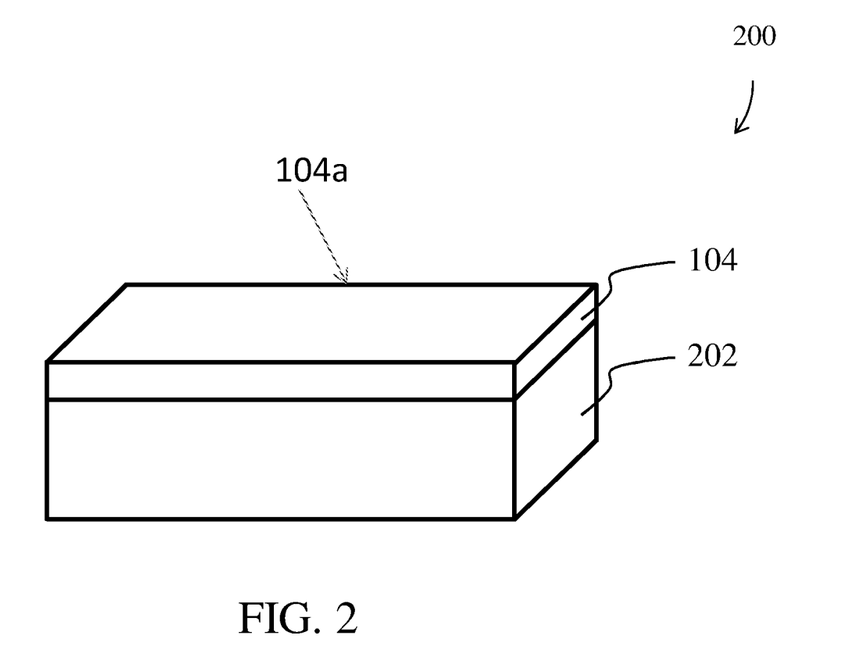
FIG. 2 is a schematic perspective view of an n-doped strained Ge film in accordance with an embodiment of the present disclosure.

By way of further illustration, FIG. 2 schematically depicts a semiconductor structure 200 according to an embodiment of the present teachings, which includes a support substrate 202 (herein also referred to as the underlying substrate 202) and a doped epitaxially-grown Ge film 104 disposed on the underlying substrate 202. In this embodiment, the underlying substrate 202 is a silicon substrate, though other types of materials, such as silicon dioxide and GaAs, can also be employed.

The Ge film has an n+-type donor concentration of at least about $5\times10^{19}$ cm$^{-3}$, e.g., a concentration in a range of about $5\times10^{19}$ to about $2\times10^{20}$ cm$^{-3}$. In some embodiments, the n-type donors comprise two or more different dopants.

The Ge film 104 exhibits a tensile strain, e.g., an in-plane tensile strain in a range of about 0.1% to about 3%, e.g., in a range of about 0.1% to about 2% or in a range of about 0.1% to about 1%, or in a range of about 0.1% to about 0.3%. In some embodiments, the Ge film can have a thickness in a range of about 10 nm to about 1 micron (e.g., in a range of about 10 nm to about 500 nm), though other thicknesses can also be employed.

In some embodiments, subsequent to the above laser-processing step, the Ge film exhibits a smooth top surface 104a. For example, the root-mean-square (rms) height variation of the top surface 104a can be less than about 5 nm, for example, in a range of about 1 nm to about 5 nm.

The above semiconductor structure 200 can be used in a variety of different applications. For example, the semiconductor structure 200 can be used in the fabrication of low resistance, high speed MOSFETS. In some cases, the semiconductor structure 200 can be used in the fabrication of lasers, e.g., lasers providing lasing radiation at a wavelength of 1550 nm. In some embodiments, a Ge film generated according to the present teachings can be used to form Ohmic contacts. Without being limited to any particular theory, the strain in the Ge film can shift the energies of unwanted electronic levels in the conduction band above those of the Γ-states, thereby modifying the Ge film from a fundamentally indirect band-gap system to a direct one.

Figure 3:
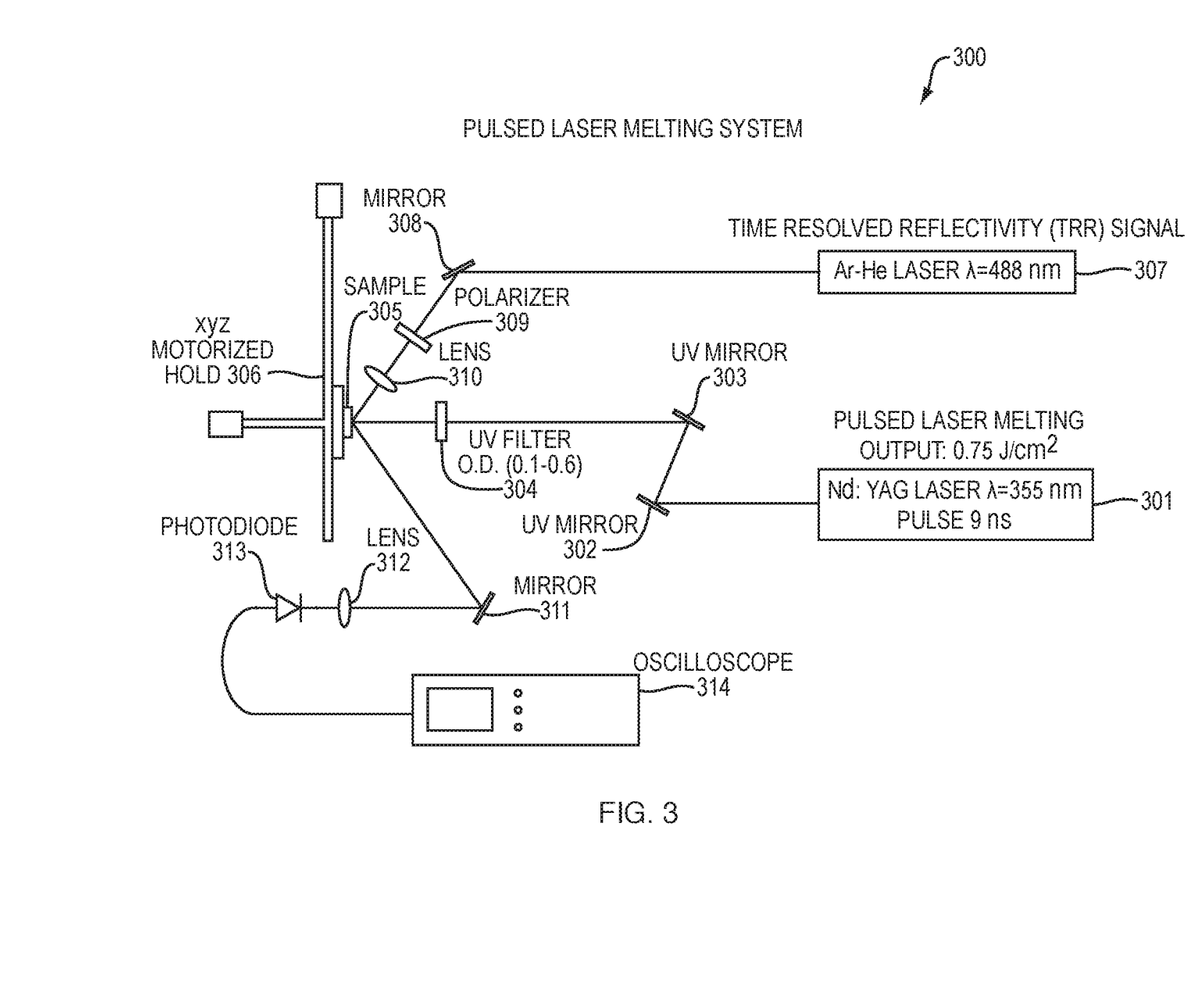
FIG. 3 is a schematic representation of a system for annealing doped Ge films via the application of one or more laser pulses in accordance with aspects of the present disclosure.

FIG. 3 schematically depicts a system 300 for exposing a doped Ge film to laser pulses. The exemplary system 300 includes a Nd:YAG laser 301 that generates 9-ns laser pulses with a center wavelength of 355 nm. A plurality of mirrors 302 and 303 direct the pulses to a lens 304, which in turn focuses the laser pulses onto a sample 305, e.g., a doped Ge film, which is mounted on a sample holder 306. The sample holder 306 can be moved in x, y, and z dimensions, and hence can allow exposing different portions of the sample to the laser pulses. In this embodiment, the system 300 further includes an Ar—He laser 307 generating continuous laser radiation at a wavelength of 488 nm. A mirror 308 directs the laser radiation onto a polarizer 309, which generates a polarized beam. The polarized beam is focused by a lens 310 at an oblique angle onto the sample 305. The reflected radiation is directed by a mirror 311 onto a lens 312, which focuses the reflected beam onto a photodiode detector 313. In this embodiment, the signals generated by the photodiode detector can be monitored and analyzed via an oscilloscope 314. By way of example, the signals can be used to perform time-resolved reflectivity measurements, which can detect a change in the reflectivity of the film as melting occurs and its return to initial state after resolidification. Such reflectivity measurements can allow for the determination of the in-situ melt time duration and the calculation of fluence in the layer.

The following example is provided for further illustration of various aspects of the invention. The example is provided only for illustrative purposes and not to necessarily indicate the optimal ways of practicing the invention or optimal results that may be obtained.

Example

Fabrication of Doped Germanium Films

Doped germanium films were fabricated by growing Ge on Si, co-implanting phosphorus and fluorine followed by laser melting the Ge. Specifically, a 1 μm in situ phosphorous doped (in-situ P doped to $8 \times 10^{18}$ cm$^{-3}$) Ge epitaxial (epi-Ge) film was grown on a p-type (100) Si wafer using a two-step ultra-high vacuum chemical vapor deposition (CVD) process. First, a 50 nm germanium buffer film was grown on the silicon substrate at a low temperature to prevent islanding, and then the rest of the film was grown at a higher temperature. Afterward, one section of the wafer with the epi-Ge film was implanted with P$^+$ ($1.85 \times 10^{15}$ cm$^{-2}$ dose, 100 keV ion energy) and another section of the wafer was implanted with P$^+$ ($1.85 \times 10^{15}$ cm$^{-2}$ dose, 100 keV ion energy) and was subsequently implanted with F$^-$ ($1.0 \times 10^{14}$ cm$^{-2}$ dose, 55 keV ion energy). The implant energies were chosen to introduce both species at a depth of 95 nm with a straggle of 45 nm and resulted in the amorphization of the first 250 nm of the doped germanium. Afterward, the implanted germanium film was laser-melted using a single nanosecond pulse (Nd:YAG, 355 nm, 4 ns full-width-half-maximum pulse duration) with a fluence of 0.75 J/cm$^2$. This fluence was chosen to reach a maximum melt depth (predicted to be 300 nm by numerical solutions to the heat equation in the sample) slightly beyond the 250-nm implant-amorphized region. Under this condition, the melt front reaches the underlying crystalline substrate and leads to single-crystal epilayer regrowth. During pulsed laser melting (PLM) of the co-implanted sample, in situ time resolved reflectivity measurements indicated a melt duration of 85 ns for the phosphorus doped films (P implanted films) and 48 ns for the phosphorus and fluorine co-implanted films (P and F co-implanted films), which is consistent with numerical simulations and suggests that the melt front reaches the expected 300-nm depth.

To characterize surface topography, the Ge:P and Ge:P+F samples were imaged with a high-resolution scanning electron microscope (SEM) before and after PLM. All subsequent measurements were performed only on the Ge:P+F sample for reasons explained below. To examine the impact of PLM on sub-surface implantation damage, cross-sectional transmission electron microscopy (XTEM) was carried out. To measure P and F concentration-depth profiles, secondary ion mass spectrometry (SIMS) was used. Further, spreading resistance profiling (SRP) measurements were carried out to determine the carrier concentration-depth profile. To quantify the effect of PLM on epilayer strain, high-resolution X-ray diffraction (HRXRD) and Raman spectroscopy measurements were employed. The HRXRD was carried out with a parabolic mirror and a Bartels Ge (220) four-crystal monochromator. The 8-keV Cu Kα$_1$ radiation was selected as the probe and the angular acceptance was reduced to 12 arcsec by a channel-cut (220) analyzer-equipped detector. Both symmetric (004) and asymmetric (444) reciprocal lattice maps were obtained to extract out-of-plane and in-plane sample strain, respectively. For the Raman measurements, a 532-nm excitation source was used and the radiation was focused to a 1-μm spot with a 100× objective lens in a confocal arrangement. The room temperature Raman scattering spectra of the laser-melted Ge was compared with that of a reference crystalline Ge wafer.

Surface Morphology from SEM

Figure 4:
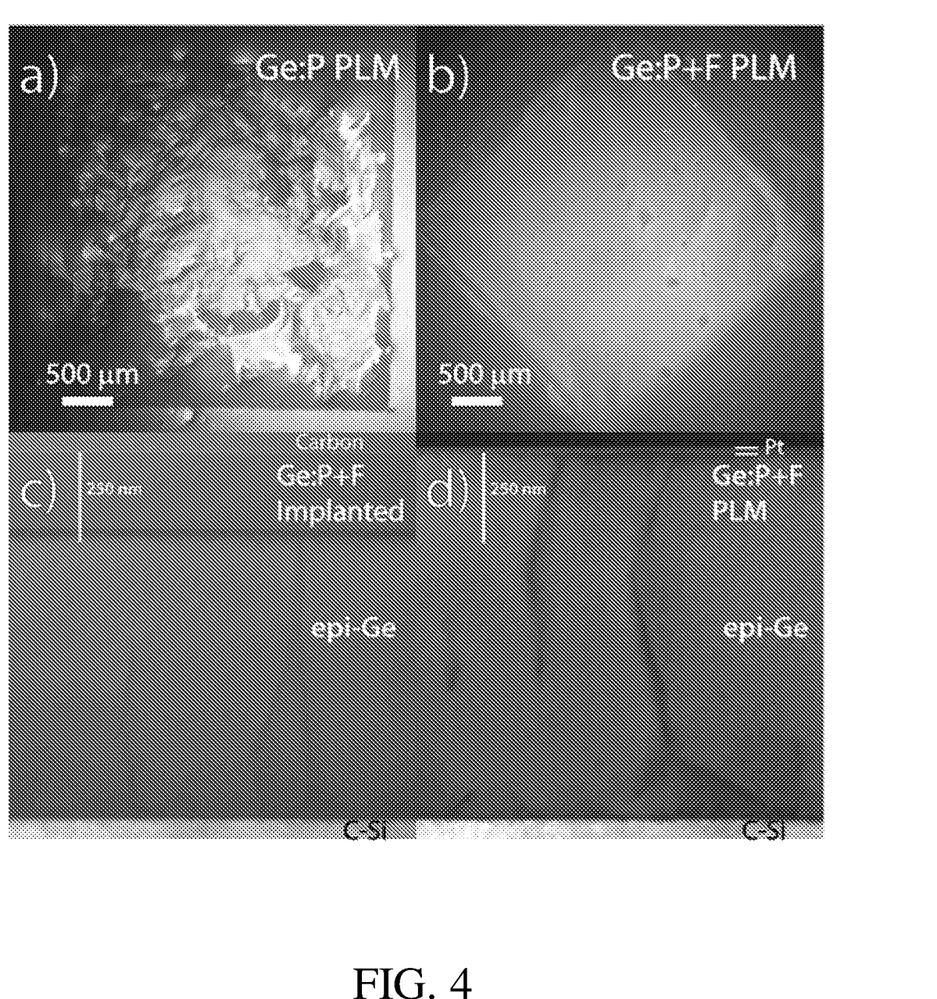
FIG. 4A is a scanning electron microscopy image of a top view of a P implanted Ge film in accordance with an embodiment of the present disclosure.
FIG. 4B is a scanning electron microscopy image of a top view of a P and F co-implanted Ge film in accordance with an embodiment of the present disclosure.
FIG. 4C is a cross-sectional transmission electron microscopy of a P and F co-implanted Ge film before pulsed laser melting in accordance with an embodiment of the present disclosure.
FIG. 4D is a cross-sectional transmission electron microscopy of a P and F co-implanted Ge film after pulsed laser melting in accordance with an embodiment of the present disclosure.

Scanning electron microscopy (SEM) and cross-sectional transmission electron microscopy (XTEM) images were taken to obtain information on the structural morphology of the doped germanium films. FIGS. 4A-B show, respectively, SEM images of a top view of a P implanted film that exhibits an ablated surface and a P and F co-implanted film that exhibits a smooth and homogeneous surface. This smoothness indicates that the presence of F suppresses ablation at this fluence. Surprisingly, ablation has not been reported in previous PLM studies of implanted Ge:P crystalline wafers using longer pulse Nd:YAG lasers (12 ns FWHM) or excimer lasers (25-50 ns FWHM). This observation suggests that the shorter 4-ns pulse duration plays a role in the ablation. As the ablated P-implanted material is unfit for device fabrication, all subsequent measurements were performed only on the co-implanted sample.

FIGS. 4C-D show, respectively, XTEM micrographs of a P and F co-implanted film before pulsed laser melting and after pulsed laser melting, respectively. The micrograph of the as-implanted sample shows the 1-µm Ge epilayer atop the crystalline Si substrate. The top 250 nm of the as-implanted film without pulsed laser melting is amorphous due to P+F implantation damage. Threading dislocations, characteristic of the two-step growth process, are visible and arise from the Ge/Si interface. The micrograph of the laser-melted sample indicates that laser melting completely restores the crystallinity of the epilayer after implantation damage, along with propagation of threading dislocations from the unmelted region to the surface. All examined regions of this sample appear free of residual implantation damage, suggesting the melt front penetrates through the entire implantation-damaged region.

The threading dislocations visible in the co-implanted sample in FIG. 4D likely arise from the epilayer growth process and not from implantation or PLM. First, no misfit dislocations or stacking faults—which would relax epilayer strain—are visible at the 300-nm melt depth in FIG. 4D. Second, the estimates of the threading dislocations (TD) per unit area (calculated from images of the fabricated XTEM lamella) for the as-implanted and laser-melted sample are the same order of magnitude (approximately $6 \times 10^7$ TD/cm$^2$). Finally, HRXRD measurements, discussed below, indicate that epilayer strain is preserved after PLM. These observations are consistent with the hypothesis that no new dislocations form after PLM.

Dopant and Carrier Concentrations

Figure 5:
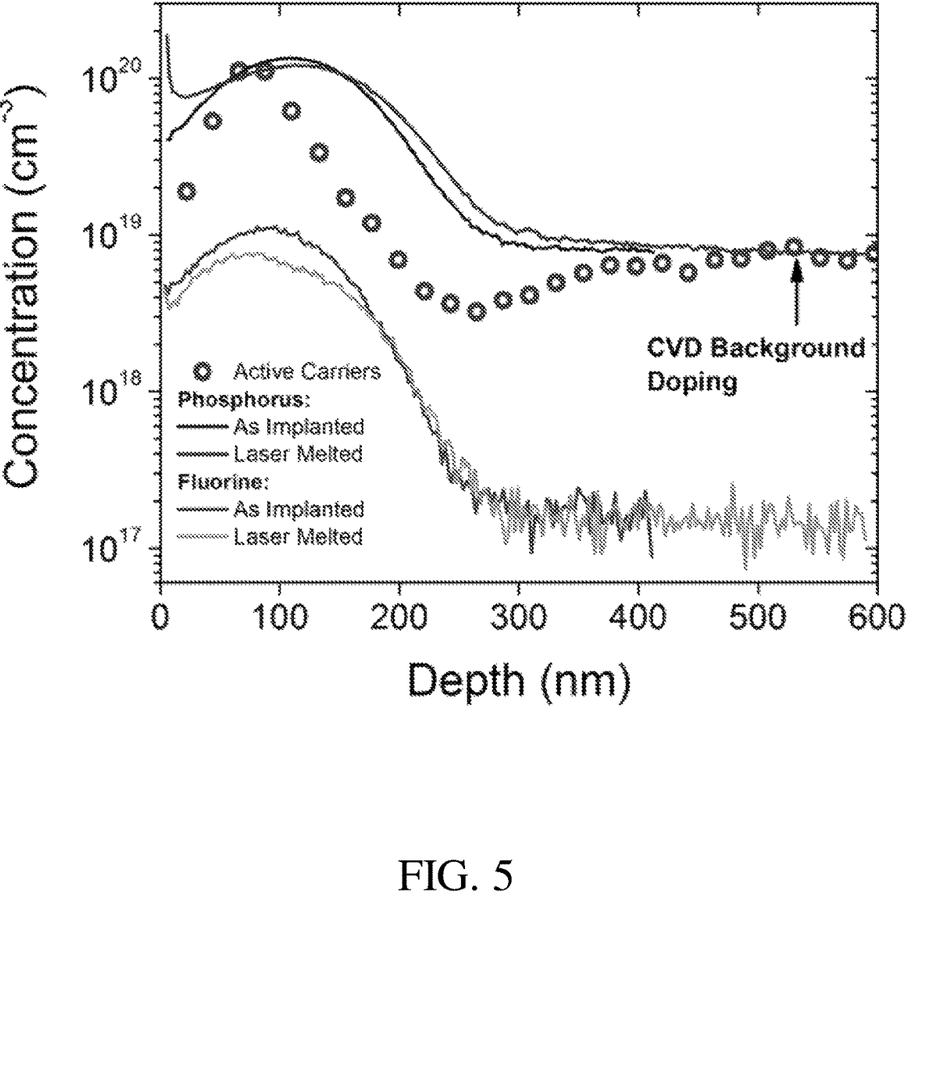
FIG. 5 is a plurality of graphs depicting the dopant concentration as a function of the Ge film depth measured by time of flight secondary ion mass spectrometry in accordance with an embodiment of the present disclosures.

FIG. 5 shows the P- and F-concentration depth profiles obtained from SIMS before and after laser melting. The as-implanted P and F concentration depth profiles each have an expected Gaussian-like shape over the first 250 nm. Both profiles have a peak concentration near 100 nm. At depths beyond the implanted region, both the as-implanted and laser-melted P-concentrations converge to $8 \times 10^{18}$ cm$^{-3}$ (i.e., the as-grown CVD background concentration). The noisy F-concentration signal beyond about 250 nm is a measurement artifact due to the SIMS detection limit near $10^{17}$ cm$^{-3}$. In the laser-melted sample, P- and F-concentration profiles are still Gaussian-like, but have undergone some impurity redistribution compared to the as-implanted profiles. The surface spike in the laser-melted P profile can be interpreted as a SIMS surface-transient measurement artifact. The P peak is asymmetrically broadened and the peak concentration is slightly reduced. This broadening in P- and F-concentration depth profiles after laser melting is characteristic of liquid-phase impurity diffusion in the melt. The observed P redistribution is less than previous Ge:P implantation PLM studies using longer pulse lasers. Without being limited to any particular theory, the shorter laser pulse length used in this example may produce a faster solidification front velocity and shorter melt duration, which reduces impurity redistribution after laser melting.

The retained impurity-doses after PLM can be estimated by comparing integrations of the SIMS profiles before and after PLM. For these estimations, an integration from a depth of 20 nm to 300 nm can be performed. The integration from 20 nm is chosen because of uncertainty in the SIMS measurement near the sample surface. These integrations indicate that, after PLM, 100% of the P as-implanted dose and around 74% of the as-implanted F dose is retained. While long-pulse PLM of P-implanted Ge results in 20% P out-diffusion, P+F co-implantation and short-pulse (4 ns) PLM used in this example can suppress P out-diffusion, even in the absence of a Ge epilayer surface cap.

Without being limited to any particular theory, the loss in the as-implanted F dose after laser-meting can be explained as follows. Compared to the as-implanted F-profile, the F-profile of the laser-melted sample has a reduced peak concentration, but no observable distribution broadening or surface accumulation. This observation suggests that the loss of F is caused by out-diffusion and evaporation from the surface during melting. This particular profile, however, would not be expected from simple Fickian diffusion with a sink due to evaporation at the free surface and partitioning at the solidification front. It is noted that significant F outgassing during solid phase epitaxy is the main challenge in RTA (rapid thermal annealing) of implanted Ge:P+F.

FIG. 5 also shows the carrier concentration in the laser-melted sample measured by spreading resistance profiling (SRP). The fraction of active donors in the laser-melted sample can be estimated by comparing integrated chemical P (SIMS) and carrier (SRP) concentration curves (integrated from 20-300 m). Assuming that an active P dopant donates one carrier, an active donor fraction, after PLM, of 44±1% can be estimated. More significantly, a peak carrier concentration of $10^{20}$ cm$^{-3}$ is observed at a depth around 80 nm. Interestingly, this peak carrier concentration coincides with the peak F concentration—not the peak P concentration. This observation is consistent with the role of F in increasing donor activation by passivating vacancies. It is noted that, at 80 nm depth, where the peak carrier and peak F concentrations coincide, the donor activation is 100%. At this depth, then, the coincidence of the peaks suggests it is reasonable to believe that the F concentration of $7 \times 10^{18}$ cm$^{-3}$, which is 7% of the P concentration, is sufficient to passivate all vacancies and produce the observed $10^{20}$ cm$^{-3}$ n$^+$ carrier concentration.

Deeper into the sample, the carrier concentration decreases from its peak and reaches a minimum around 260 nm. This minimum carrier concentration is smaller than the as-grown background carrier P concentration (visible beyond around 350 nm). The dip in carrier concentration is likely due to accumulated point defects, most likely vacancies. Previous studies of laser-melted Si and Ge have observed accumulated vacancies beyond the maximum melt depth. It is possible that vacancies beyond the melt depth interact with P and decrease carrier activation in the region with the minimum carrier concentration.

Strain

Figure 6:
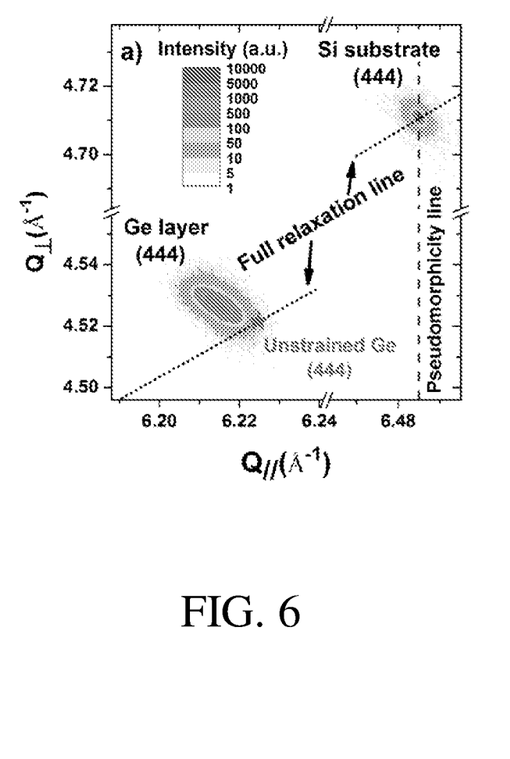
FIG. 6 is a reciprocal lattice mapping in an asymmetric configuration (444) of a P and F co-implanted Ge film after pulsed laser melting obtained by high-resolution x-ray diffraction in accordance with an embodiment of the present disclosure.

FIG. 6 shows the asymmetric (444) reciprocal space map of the laser-melted sample obtained from HRXRD measurements to investigate sample strain. The dotted full relaxation line consists of coordinates for unstrained, relaxed cubic lattices of varying lattice parameters. Both measured Ge epilayer and Si substrate peaks are visible in the map. The Ge peak is significantly broadened and displaced from the full relaxation line. This peak broadening is consistent with the presence of epilayer threading dislocations in the sample observed by XTEM. The peak displacement from the full relaxation line indicates tensile biaxial in-plane strain in the epilayer explained as follows. The peak centroid is shifted to a smaller value of $Q_{//}$ as compared to the $Q_{//}$ of fully relaxed, unstrained Ge represented by the star on the dotted full relaxation line. This peak displacement indicates that the measured Ge has a larger in-plane lattice-constant than unstrained Ge (i.e., it has tensile biaxial in-plane strain). The shift is in the opposite direction for $Q^\perp$, indicating that the measured Ge has compressive out-of-plane strain. This reciprocal space map of the laser-melted sample is virtually identical (i.e., no observable change in coordinate peak positions) to the map of the as-implanted sample (not shown). This reciprocal map similarity supports the assertion that epilayer strain is retained after PLM.

Calculated strain values of the as-implanted and laser-melted samples are shown in Table 1 below. These values were calculated from the distances between the Ge and Si peaks along the $Q^\perp$ and $Q_{//}$ directions and report the perpendicular ($\varepsilon_\perp$) and parallel ($\varepsilon_{//}$) strain with respect to relaxed cubic Ge (lattice constant a=0.5658 nm). The reported strain values are characteristic of epilayer Ge grown from the two-step growth process used in this example. It can thus be concluded that the as-grown tensile biaxial in-plane strain of +0.16% is preserved after PLM with an uncertainty of ±0.03%.

| Sample | Symmetric (004) | | Antisymmetric (444) | | |
|---|---|---|---|---|---|
|  | $a_\perp^{Layer}$ (Å) | $\varepsilon_\perp$ (%) | $a_{//}^{Layer}$ (Å) | $\varepsilon_{//}$ (%) | $\Delta V/V_{Ge}$ (%) |
| As implanted | 5.6507 ± 0.0001 | −0.129 ± 0.002 | 5.6673 ± 0.0002 | +0.164 ± 0.003 | +(0.20 ± 0.01) |
| PLM 0.75 J/cm² | 5.6508 ± 0.0001 | −0.129 ± 0.002 | 5.6671 ± 0.0002 | +0.161 ± 0.003 | +(0.20 ± 0.01) |

The uncertainty in the reported strain values arises because the HRXRD Ge signal originates not only from the laser-melted portion of the epilayer, but from the entire epilayer. The X-rays can penetrate through the depth of each sample; the recorded Ge signal of scattered X-rays thus emanates from the entire Ge epilayer. The strain values reported here therefore characterize the average strain of the entire epilayer (i.e., not just the top epilayer portion that has been implanted and/or laser melted). Dislocations create an inhomogene ous deformation field that can prevent accurate strain depth profiling, which would isolate the strain of the laser-melted epilayer region. Nonetheless, the data indicates that epilayer strain is preserved after PLM within ±0.03%. It was calculated (using the RADS code) that epilayer strain variations larger than ±0.03% in the top 250 nm (i.e., the laser-melted, implanted region), balanced by a corresponding strain variation of opposite sign in the unmelted portion of the Ge epilayer, would split the observed Ge peak under HRXRD conditions used herein. As such a peak splitting was not observed, ±0.03% was used as an upper limit in the overall uncertainty range in the reported strain values.

Raman Results

Figure 7:
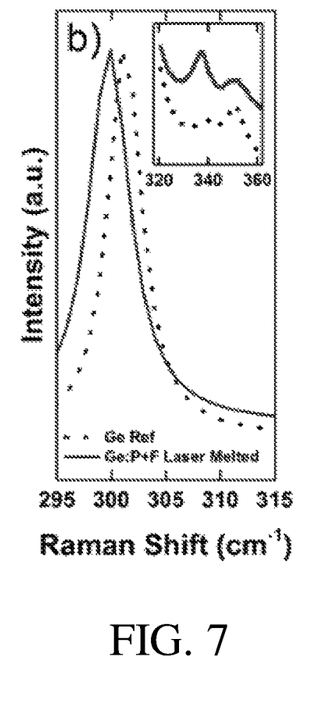
FIG. 7 shows Raman spectra of a reference unstrained, Ge crystal substrate and a Ge:P+F epilayer after PLM at 0.75 J/cm$^2$ (the inset of FIG. 7 shows a peak corresponding to Ge—P local vibrational mode).

FIG. 7 shows the normalized Raman spectra of the laser-melted sample and a reference crystalline Ge substrate using a 532-nm probe laser. Considering the absorption coefficient of crystalline Ge at 532 nm ($\alpha$=0.5×10⁶ cm⁻¹), it can be estimated that the Raman signal originates from the top 25 nm of each sample (i.e., from only the implanted and laser-melted portion of the epilayer). The epilayer Raman peak after PLM is redshifted by about 1 cm⁻¹ relative to the unstrained crystalline Ge substrate peak. Using this measured shift and a strain calculation methodology that takes into account Poisson's ratio and the longitudinal and transverse deformation potentials, an epilayer tensile biaxial in-plane strain of +0.24% can be obtained. This value qualitatively confirms the presence of tensile biaxial in-plane strain in the epilayer calculated from HIRXRD measurements. The inset of FIG. 7 also shows a scattering peak at 337 cm⁻¹, which can be attributed to the Ge—P local vibrational mode. This mode corresponds to substitutional P in the Ge lattice; its presence implies that a fraction of the incorporated P is substitutional. This substitutional Raman mode was previously observed in a laser-melted, P-implanted Ge substrate with a 10²⁰ cm⁻³ P concentration.

Those having ordinary skill in the art will appreciate that various changes can be made to the above embodiments without departing from the scope of the invention. The recited numerical ranges are intended to include all individual values within those ranges.

What is claimed is:

1. A semiconductor structure, comprising:
   a support substrate,
   an n-doped strained Ge film disposed on said substrate, wherein said Ge film has an active donor concentration of an electron-donating dopant of at least about 1×10²⁰ cm⁻³ for at least one depth less than about 200 nm and exhibits a substantially crystalline structure, and
   wherein said n-doped strained Ge film further comprises at least another dopant that is capable of passivating vacancies in said Ge film.

2. The semiconductor structure of claim 1, wherein said active donor concentration is in a range of about 1×10²⁰ cm⁻³ to about 2×10²⁰ cm⁻³.

3. The semiconductor structure of claim 1, wherein said support substrate is a semiconductor.

4. The semiconductor structure of claim 1, wherein said support substrate is any of silicon, silicon dioxide and GaAs.

5. The semiconductor structure of claim 1, wherein said electron-donating dopant comprises any of antimony, phosphorus and arsenic.

6. The semiconductor structure of claim 1, wherein said at least another dopant comprises any of fluorine, nitrogen and carbon.

7. The semiconductor structure of claim 1, wherein said Ge film has a thickness in a range of about 10 nm to about 1 micron.

8. The semiconductor structure of claim 1, wherein said Ge film exhibits a strain in a range of about 0.1% to about 3%.

9. A semiconductor structure, comprising:
   a support substrate,
   an n-doped strained Ge film disposed on the substrate, wherein said Ge film exhibits a substantially crystalline structure, and wherein the Ge film comprises two or more dopants and exhibits an active donor concentration of an electron-donating dopant of at least about $5 \times 10^{19}$ cm$^{-3}$, wherein at least one dopant of the two or more dopants is capable of passivating vacancies present in the Ge film when implanted therein.

10. The semiconductor structure of claim 9, wherein the at least one dopant is fluorine.

* * * * *